United States Patent
Nygard (10) Patent No.: US 7,388,185 B2
(45) Date of Patent: Jun. 17, 2008

(54) PIXEL DETECTOR AND METHOD OF MANUFACTURE AND ASSEMBLY THEREOF

(75) Inventor: Einar Nygard, Asker (NO)

(73) Assignee: Intercon AS, Asker (NO)

( * ) Notice: Subject to any disclaimer, the term of this patent is extended or adjusted under 35 U.S.C. 154(b) by 158 days.

(21) Appl. No.: 10/575,244

(22) PCT Filed: Oct. 4, 2004

(86) PCT No.: PCT/IL2004/000915

§ 371 (c)(1),
(2), (4) Date: Apr. 10, 2006

(87) PCT Pub. No.: WO2005/034241

PCT Pub. Date: Apr. 14, 2005

(65) Prior Publication Data

US 2007/0134906 A1    Jun. 14, 2007

(30) Foreign Application Priority Data

Oct. 9, 2003    (IL) .................................... 158345

(51) Int. Cl.
*H01L 27/00* (2006.01)
(52) U.S. Cl. .............................. 250/208.1; 250/214.1; 250/370.09
(58) Field of Classification Search .............. 250/208.1, 250/214.1, 370.09
See application file for complete search history.

(56) References Cited

U.S. PATENT DOCUMENTS 4,547,792 A    10/1985    Sclar
4,857,746 A    8/1989    Kuhlmann et al.

(Continued)

FOREIGN PATENT DOCUMENTS

EP    0 537 514 A2    4/1993

(Continued)

OTHER PUBLICATIONS

Tewksbury et al; "Cointegration of Optoelectronics and Submicron CMOS"; Wafer Scale Information, 1993. Proceedings., Fifth Annual IEEE International Conference on San Francisco, CA USA; Jan. 20, 1993; pp. 358-367; XP010067696.

(Continued)

*Primary Examiner*—Georgia Y. Epps
*Assistant Examiner*—Seung C Sohn
(74) *Attorney, Agent, or Firm*—Lowe Hauptman Ham & Berner LLP (57) ABSTRACT

A detector assembly (50) is formed by integrating the electronic processing circuits on a CMOS wafer by stitching a plurality of reticles of at least two different types so as to form an integrated circuit having an array of electronic processing circuits each having a respective sensor input disposed toward a first surface of the wafer and accessible from the first surface via a contact formed near an edge of the integrated circuit. Sensor elements (56) are disposed on the first surface of the respective integrated circuits in the detector whereby an exposed surface of the sensor elements forms a common first electrode towards which incident photons are directed, and an opposite unexposed surface thereof forms multiple second electrodes of opposite polarity to the first electrode each in registration with a corresponding sensor input.

12 Claims, 6 Drawing Sheets

U.S. PATENT DOCUMENTS

| | | |
|---|---|---|
| 5,132,539 A | 7/1992 | Kwasnick et al. |
| 5,254,868 A | 10/1993 | Saito |
| 5,391,879 A * | 2/1995 | Tran et al. ............... 250/367 |
| 5,563,414 A * | 10/1996 | Sklebitz ................. 250/368 |
| 5,998,292 A | 12/1999 | Black et al. |
| 6,416,218 B1 | 7/2002 | Cheung |

FOREIGN PATENT DOCUMENTS

| | | |
|---|---|---|
| EP | 1 045 450 A3 | 5/2002 |
| EP | 1 253 442 A1 | 10/2002 |
| JP | 61 128 564 A2 | 6/1986 |
| WO | 02/067014 A1 | 8/2002 |
| WO | 03/083944 A1 | 10/2003 |

OTHER PUBLICATIONS

Flack et al; :Lithographic Manufacturing Techniques for Water Scale Integration; Wafer Sale Integration, 1992. Proceedings., Fourth International Conference on San Francisco, CA USA, Jan. 22, 1992; pp. 4-13, XP010026528.

Banthien et al; A Vertically Integrated High Resolution Active Pixel Image Sensor for Deep Submicron CMOS Processes; presented to 1999 IEEE Workshop on CCDs and Advance Image Sensors, Nagano Japan, Jun. 10-12, 1999.

* cited by examiner

PIXEL DETECTOR AND METHOD OF MANUFACTURE AND ASSEMBLY THEREOF

FIELD OF THE INVENTION

This invention relates to pixel sensors for use in X-ray and γ-cameras.

BACKGROUND OF THE INVENTION

Pixel sensors are known to comprise an array of sensor elements such as diodes, and a complementary array of electronics, typically in the form of an ASIC and comprising a charge amplifier and processing electronics for each sensor element. In CCDs such as are used in miniature television cameras and the like, the sensor elements are formed of silicon diodes which are responsive to visible light for producing a current which is amplified by the charge amplifier and subsequently processed.

Pixel sensors for X-ray and nuclear medical imaging are known that respond to high-energy photons such as X-rays or γ-rays and produce charge in a similar manner. Conventional silicon diodes are not suitable for such applications because they are transparent to the high-energy photons and therefore other materials such as cadmium telluride or mercuric iodide are used instead. Since these materials are not based on silicon, the diode cannot be integrated together with the associated electronics as a single monolithic structure and this requires, in practice, that the sensor elements and the associated electronics be manufactured on separate wafers, which are then interconnected using bump bonding.

Figure 1:
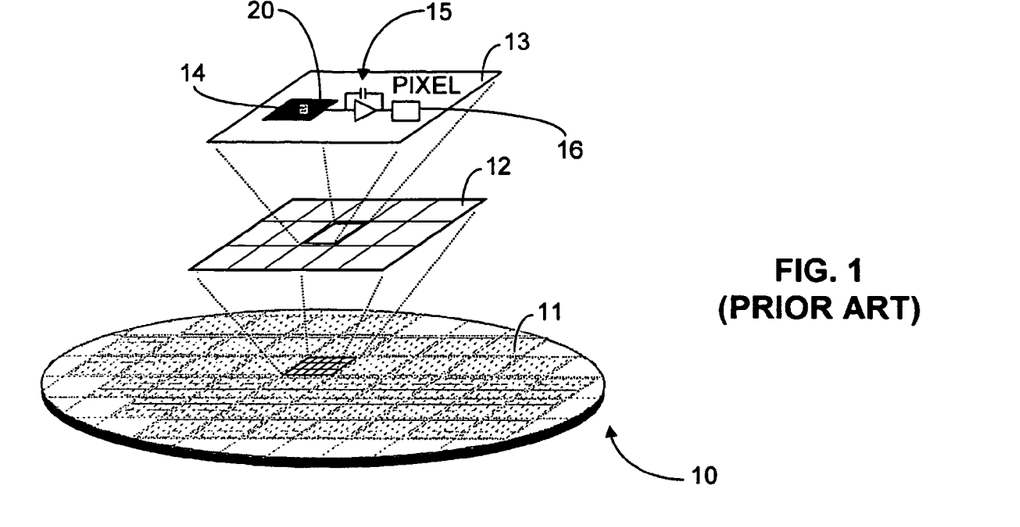
FIGS. 1 and 2 show pictorially prior-art pixel sensor assemblies.

Our prior application WO 03/083944 entitled "*Pixel sensor array and method of manufacture thereof*" and filed Feb. 18, 2003 discloses a sensor array having a plurality of pixels formed on a wafer 10 as shown in FIG. 1. The wafer 10 constitutes an integrated circuit or chip, typically formed of a complementary metal oxide semiconductor (CMOS) wafer and provided with scribe lines 11 so as to form a rectangular matrix of sensor elements 12 each of which, in turn, comprises a matrix of 3×5 pixels 13. The wafer 10 is processed at a silicon foundry in known manner and for the purpose of low-cost mass-production is processed according to the invention as an uncut wafer bearing multiple replicas of the same integrated circuit. Each pixel 13 includes a sensor input 14 that is connected to a charge amplifier 15 and a processing unit 16. The charge amplifier 15 together with the processing unit 16 constitute the pixel electronics to which the sensor element (not shown) is connected and which responds to a photon striking the sensor element for measuring the charge produced thereby. Thus, the silicon wafer 10 contains multiple replicas of the pixel array 12, and the silicon wafer 10, after scribing, would produce multiple ASICs each containing, for example, an array of 3×5 pixel electronic circuits for connecting to a respective sensor element.

In order to obviate the need for wire bonding as commonly used in pixel sensors, WO 03/083944 connects each sensor input 14 via a respective ohmic contact (or "via") through the silicon wafer to the reverse side thereof. This contact may then be used to connect the sensor element directly to the sensor electronics by effectively bonding the sensor element in correct spatial disposition with respect to the electronics on the reverse side of the silicon wafer.

Reference is also made to "*A vertically integrated high resolution active pixel sensor for deep submicron CMOS processes*" by Stephan Benthien et al. presented to the IEEE Workshop on CCDs and Advanced Image Sensors, Jun. 10-12, 1999. This article describes a multi-pixel CMOS array for visible light applications, such as photography. It employs thin film ASIC (TFA) technology to deposit an amorphous silicon detector on a pre-fabricated ASIC. The article does not address the need for a multi-pixel sensor array that is amenable to formation of a large area sensor assembly having multiple sensor arrays juxtaposed and makes no provision for such assembly.

Figure 2:
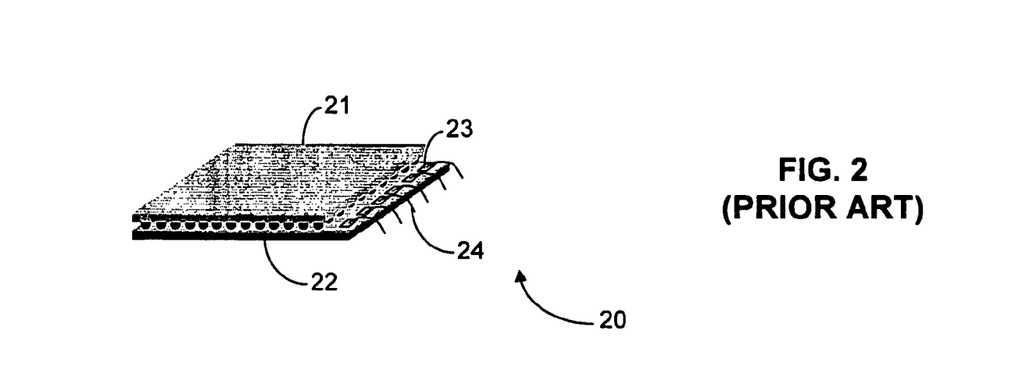

FIG. 2 shows pictorially a typical arrangement comprising a standalone 2-D pixel sensor depicted generally as 20 and comprising an upper sensor array 21 comprising multiple sensor elements (not shown), each of which is bump-bonded to a corresponding electronics module in a lower ASIC 22. In addition, power and control signals are fed to the sensor 20 and this typically requires that control-pads 23 be formed along at least one edge of the composite chip and which may be connected to external circuitry using wire-bonding 24.

The typical size of each pixel in such an array is 200 μm and the typical dimension of the two-dimensional array is 1 cm². This means that there are typically some 625 pixels per pixel array. In practice, it is usually necessary to image over a much larger area, for example at least 10×10 cm². This requires that 100 pixel arrays must be packed together, for example as a 10×10 matrix. On the one hand, the bump bonding technique used in conventional pixel sensors militates against the closer packing density of the pixels so that it becomes difficult to increase the resolution of the sensor by packing more pixels into a pixel array, since the need to bump-bond each sensor to the corresponding electronics in a different array is a costly process and is subject to low yields. Furthermore, the provision of control-pads along an edge of each module and the need to wire bond these pads to external circuitry means that adjacent sensor arrays cannot be packed edge-to-edge without introducing a "dead" zone where there are, in fact, no pixels at all owing to the interposing I/O and control-pads. Moreover, the connection of the I/O control-pads to the external circuitry by wire bonding is also a costly and cumbersome process and further reduces the effective overall packing density.

U.S. Pat. No. 5,254,868 (Yutaka) published Oct. 19, 1993 and entitled "*Solidstate image sensor device*" discloses a semiconductor image sensor device comprising arrayed photo-sensors, wherein a connection electrode used for connecting an external circuit or an aperture on the connection electrode is provided at an opposite side surface to an illuminated surface, and a transparent substrate is provided above the arrayed photo-sensors. By such means the distance between a light source and the photo-sensors can be reduced so as to improve sensitivity and resolving power.

U.S. Pat. No. 5,998,292 (Black et al.) issued Dec. 7, 1999 and entitled "*Method for making three dimensional circuit integration*" discloses a method for interconnecting, through high-density micro-post wiring, multiple semiconductor wafers with lengths of about a millimeter or below. The method comprises etching at least one hole, defined by walls, at least partly through a semiconducting material; forming a layer of electrically insulating material to cover said walls; and forming an electrically conductive material on said walls within the channel of the hole.

JP61 128564A2 (Fujitsu Ltd.) published Jun. 16, 1986 and entitled "*Semi-conductor Device*" describes a process for forming a photodetecting section and a driving circuit on the surface and the back of the same substrate and connecting both by a wiring through a through-hole. An amplifier and other driving circuits are shaped to a Si growth layer, and an n type region is formed through the implantation of B+ ions in order to shape a P-N junction for a photodetecting element. Aluminum for a wiring is shaped so as to unit one part of the n type region and the Si growth layer side where the driving circuit is formed, and shaped through a method, such as ion beam evaporation, electron beam evaporation, etc. while masking sections except a required section. Aluminum is evaporated from both upper and lower surfaces, and the wiring is connected by plating. An HgCdTe growth section in the photo-detecting element section and the Si growth layer are displaced, and formed on both surfaces of a sapphire substrate.

Such a configuration appears to relate to a single photodetector only and the silicon is not pre-fabricated but rather is grown on top of the sapphire substrate.

EP1 045 450A2 (Agilent Technologies Inc.) published Oct. 18, 2000 and entitled "*Image sensor array device*" discloses an image sensor array that includes a substrate. An interconnect structure is formed adjacent to the substrate. An amorphous silicon electrode layer is adjacent to the interconnect structure. The amorphous silicon electrode layer includes electrode ion implantation regions between pixel electrode regions. The pixel electrode regions define cathodes of an array of image sensors. The electrode ion implantation regions provide physical isolation between the pixel electrode regions. The cathodes are electrically connected to the interconnect structure. An amorphous silicon I-layer is adjacent to the amorphous silicon electrode layer. The amorphous silicon I-layer forms an inner layer of each of the image sensors. A transparent electrode layer is formed adjacent to the image sensors. An inner surface of the transparent electrode layer is electrically connected to anodes of the image sensors and the interconnect structure. The amorphous silicon I-layer can further include I-layer ion implantation regions that provide physical isolation between the inner layers of the image sensors. The I-layer ion implantation regions align with the electrode ion implantation regions. An amorphous silicon P-layer can be formed adjacent to the amorphous silicon I-layer. The amorphous silicon P-layer forms an outer layer of each of the image sensors. The amorphous silicon P-layer can include P-layer ion implantation regions that provide physical isolation between the outer layers of the image sensors.

EP 537 514A2 (Mitsubishi corporation) published Apr. 21, 1993 and entitled "*Optoelectronic integrated circuit*" discloses an optoelectronic integrated circuit including a light receiving element for converting an optical signal to an electric signal and an electronic circuit for processing the electric signal. The light receiving element is disposed on a first main surface of the substrate and includes p side electrodes and n side electrodes alternately arranged in parallel to each other. The electronic circuit is disposed on a second main surface of the substrate. The light receiving element is electrically connected to the electronic circuit by a via hole penetrating through the substrate.

U.S. Pat. No. 4,547,792 (Sclar) issued Oct. 15, 1985 and entitled "*Selective access array integrated circuit*" discloses a semiconductor integrated circuit having an array of electronic devices and a plurality of electronic access devices. The access devices consist of sets of MOSFETs which may be turned on by the joint action of X and Y address lines to permit individual and isolated electrical connection between selected electronic devices in the array and peripheral on or off-hip sensing circuits. This permits continuous readout to be established and maintained for the selected devices without interference with the other devices in the array and without a requirement to readout any but the selected devices. In order to provide minimum dead space between the array detectors, the array and access devices may be disposed on opposite surfaces of the semiconductor body.

U.S. Pat. No. 4,857,746 (Werner et al.) issued Aug. 15, 1989 and entitled "*Method for producing an optocoupler*" discloses a method for manufacturing optocouplers or reflex light barriers, wherein semiconductor light transmitters and semiconductor light receivers are situated on a single substrate. The optic coupling or optic isolation of light transmitter and light receiver takes place in the substrate. Only then are semiconductor elements separated into discrete units.

Regardless of what technology is used to fabricate the sensor array, and regardless of the size of the sensor array, a practical CT detector typically requires that multiple sensor arrays be juxtaposed edge to edge in order to provide adequate coverage. Inevitably this introduces some "dead space" between adjacent sensor arrays which is insensitive to incoming photons as discussed above. It is clearly desirable to reduce the dead space as much as possible. The small size of hitherto-proposed sensor arrays such as shown in FIG. 2 having contact pads at an edge on the one hand militates against their use as standalone X-ray or γ-ray detectors and, on the other hand, renders it inevitable that when juxtaposed edge to edge there will be created dead spaces in the central regions of the detector which are insensitive to incoming photons.

Our WO 03/083944 as well as some of the other references discussed above address this problem and provide one solution: namely the provision of conductive vias so that connections to the sensor elements can be effected through the reverse side of the wafer. This solution is effective but the need to provide the conductive vias complicates the manufacturing process.

EP1253442A1 published Oct. 30, 2002 in the name of Hamamatsu Photonics and entitled "*X-Ray image sensor*" discloses a scintillator substrate constituted by an X-ray-transparent substrate and a scintillator in contact with the imaging plane of a solid-state imaging device. The solid-state imaging device and a frame are secured onto a base plate. The substrate is set relatively thin to improve its X-ray transmissivity.

U.S. Pat. No. 5,132,539 (Kwasnick et al.) published Jul. 21, 1992 and entitled "*Planar X-ray imager having a moisture-resistant sealing structure*" discloses a radiation imager comprising a scintillator mated to a photodetector array.

These prior art references are representative of X-ray imaging devices employing scintillators. These are not direct detection devices since their principle of operation is that incoming X-rays strike the scintillator where they produce light, which then strikes the adjacent photodetector array so as to generate spatial information relating to the position on the scintillator where the incident X-rays impinged. Such an approach is prone to inaccuracy since the light generated by the scintillator is apt to disperse and strike adjacent pixels of the photodetector array thereby resulting in poor spatial resolution. Moreover, scintillator detectors have poorer Detection Quantum Efficiency leading to higher patient dosage.

It would therefore be desirable to provide a large area sensor array suitable for that obviates the need to provide conductive vias through the silicon wafer, but nevertheless avoids dead space associated with know approaches and offers superior performance to scintillator detectors.

SUMMARY OF THE INVENTION

It is thus an object of the invention to provide a pixel sensor array particularly suitable for use with X-ray imaging that obviates the need to provide conductive vias through the silicon wafer, but nevertheless avoids dead space in the central regions of the detector.

This object is realized in accordance with a first aspect of the invention by a method for fabricating a detector having a plurality of pixels each including a sensor element coupled to a sensor input of an electronic processing circuit, the method comprising:

integrating the electronic processing circuits on a CMOS wafer by stitching a plurality of reticles of at least two different types so as to form an integrated circuit having an array of electronic processing circuits each having a respective sensor input disposed toward a first surface of the wafer and accessible from the first surface via a contact formed near an edge of the integrated circuit; and disposing the sensor elements on the first surface of the respective integrated circuits in said detector whereby an exposed surface of the sensor elements forms a common first electrode towards which incident photons are directed, and an opposite unexposed surface thereof forms multiple second electrodes of opposite polarity to the first electrode each in registration with a corresponding sensor input.

Preferably, such a method is used in order to integrate integrating the electronic processing circuits on a very large area CMOS wafer to form a rectangular IC module having a major edge and a minor edge, the major edge having a dimension that is substantially half of a width of the detector. Each rectangular IC module has at least one array of electronic processing circuits each having a respective sensor input disposed toward a first surface of the wafer and accessible from the first surface via a contact formed towards a minor edge of the IC module. Multiple pairs of IC modules are juxtaposed edge to edge so that respective minor edges of each of pair are juxtaposed with the respective contacts of each IC module disposed toward opposing outer non-contiguous edges of the detector and with adjacent pairs of integrated circuits being juxtaposed along their major edges. Sensor elements are then disposed on the first surface of the respective IC modules in the detector whereby an exposed surface of the sensor elements forms a common first electrode towards which incident photons are directed, and an opposite unexposed surface thereof forms multiple second electrodes of opposite polarity to the first electrode each in registration with a corresponding sensor input.

The invention is based on the use of CMOS ICs having a very large surface area, typically an order of magnitude larger than those used hitherto in the manufacture of sensor arrays. This is a fairly new fabrication process that allows CMOS to be integrated in larger wafer size. Thus, for example, while conventional CMOS wafers have a major dimension of at most several centimeters, CMOS wafers manufactured according to this technology may have a stitched reticle size exceeding 10 cm and this is likely to increase in the near future.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF EXEMPLARY EMBODIMENTS

The present invention is based on the fabrication of different architectures on a single CMOS wafer using "stitching". To this end, it will aid in appreciating the inventive concept of the present invention if a brief introduction to stitching is presented even though the technique is not novel per se. On the other hand, a sensor array manufactured according to the invention is visibly distinguished from hitherto known sensor arrays on account of the stitching and it is therefore important that the distinction be appreciated.

In the fabrication of CMOS circuits, thin wafers are sliced from bulk pure silicon. Each thin wafer may have a diameter of approximately 30 cm (12") and from this single wafer multiple integrated circuits (ICs) are produced using known lithographic techniques. Commonly a large number of identical ICs are fabricated from a single wafer and, to this end, artwork masks corresponding to the desired IC circuitry are imaged at spaced apart intervals to form a matrix of reticles on the wafer, each corresponding to a single IC. For example, a typical CPU chip may measure 2×2 cm such that approximately 100 identical ICs can be manufactured on a single wafer. This assumes that a square having a side of 20 cm has a diagonal of nearly 30 cm and can just fit inside a circular wafer having a diameter of 30 cm and ignores the area bounded by the circumference of the wafer and subtended by the four sides of the square, which can accommodate additional ICs.

Owing to the large number of contacts required to allow state-of-the-art CPU chips to interface with the outside world, contact pads are provided around the complete periphery of the chip in what is know as a pad ring. The pad ring not only embeds the contacts, but also serves as a boundary between adjacent ICs within which they can be scribed and separated.

The above description relates to the conventional fabrication of identical ICs from a single CMOS wafer. However, it is also possible to fabricate ICs having a surface area larger than 2×2 cm using a technique known as "stitching".

Figure 3:
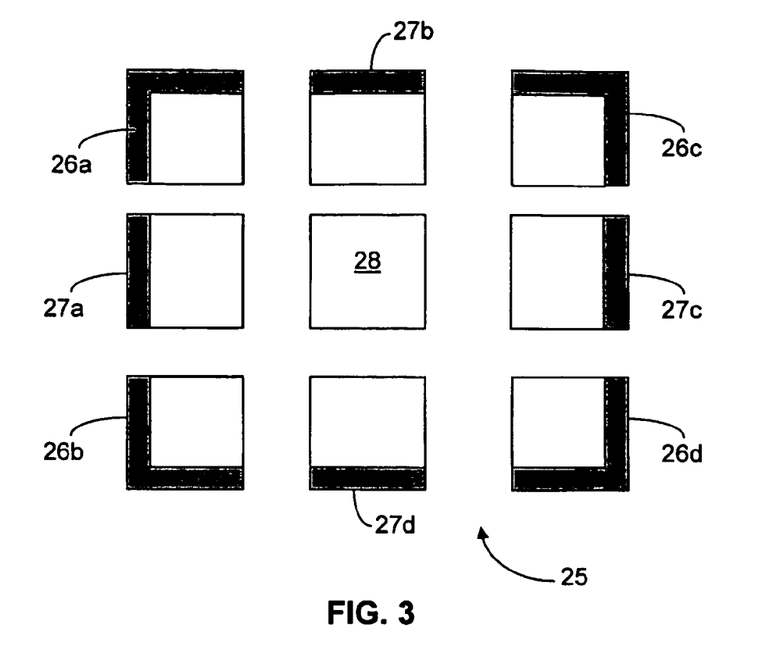
FIGS. 3 and 4 show pictorially fabrication of a large area CMOS IC using stitched reticles.

FIG. 3 shows schematically a set of nine reticles that may be juxtaposed to form a large area CMOS IC shown generally as 25 comprising four corner reticles 26a, 26b, 26c and 26d, four side reticles 27a, 27b, 27c and 27d and a single center reticle 28. All of these reticles are different but a composite large area CMOS IC of any size can be constructed from repeated juxtaposition of the side reticles 27a, 27b, 27c and 27d and the center reticle 28 subject, of course, to the physical limitation inherent in the dimensions of the CMOS wafer. Thus, the width of the IC can be extended simply by using more of the upper and lower side reticles 27b and 27d; the height of the IC can be extended simply by using more of the left and right side reticles 27a and 27c; and the intermediate area is filled by suitable juxtaposition of additional center reticles 28.

Figure 4:
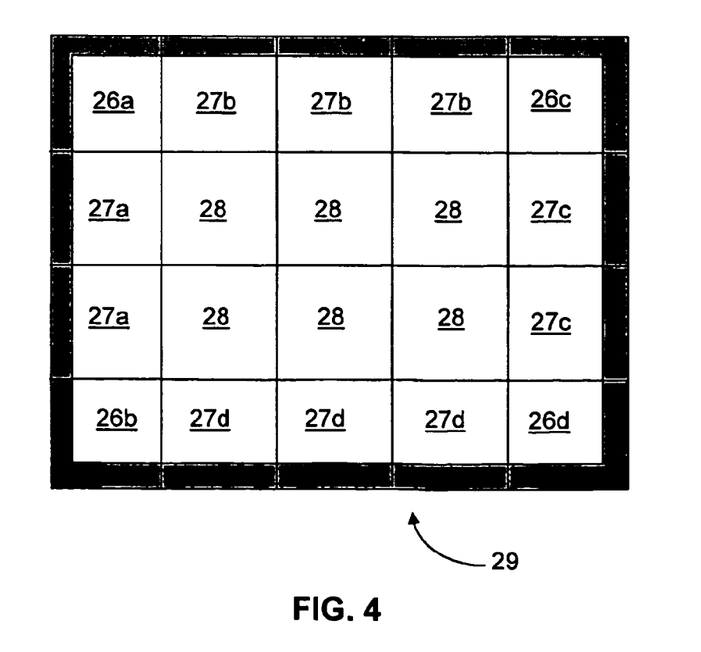

FIG. 4 shows such a composite IC depicted 29 having an overall width of 10 cm and a height of 8 cm formed by stitching reticles as described above. It will, of course, be apparent that continuity between adjacent reticles must be preserved so that, for example, the right edge of reticles 27a continues to the left edge of reticles 28. It also follows that the right edge of reticles 28 continues to the left edge of reticles 28 and also to the left edge of the reticles 27c. This requires very careful design of the reticles: but once they are formed it is clear that a suitable combination of the nine reticles can be stitched to form an IC of required overall dimensions subject, of course, the limitation offered by the diameter of the CMOS wafer. Moreover, the asymmetry of the chip design both along adjacent and opposing borders as well as at the corners; and the common asymmetry of these features with those in the central area of the chip all point to the need to fabricate the chip using stitched reticles. Consequently, since the IC is too large to have been formed from a single mask, one skilled in the art will readily discern that the composite IC is formed of stitched reticles.

Figure 5:
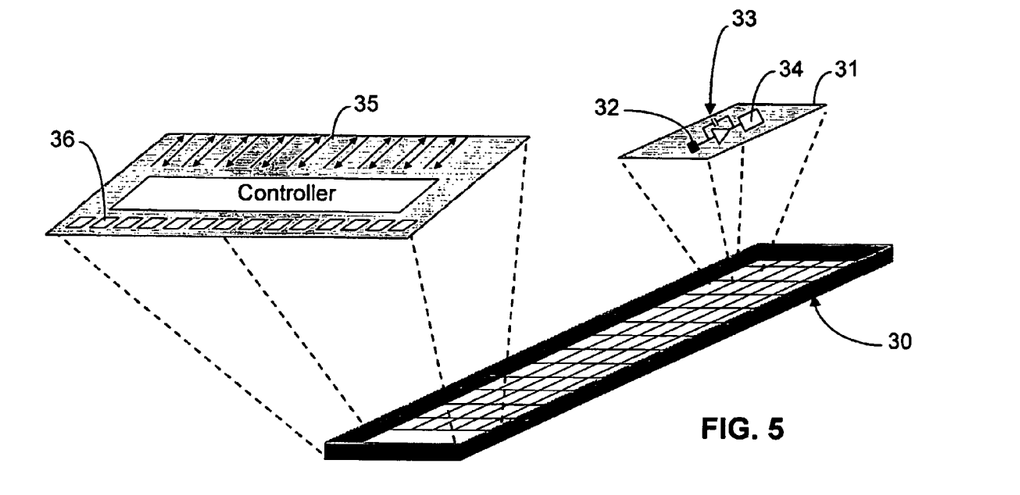
FIG. 5 shows pictorially an exploded view of a sensor array that is mass-manufactured on a silicon wafer in a first manufacturing step according to the invention.

FIG. 5 shows pictorially an exploded view of a silicon wafer 30 constituting an integrated circuit or chip, typically formed of a complementary metal oxide semiconductor (CMOS) wafer comprising a large area rectangular matrix of sensor elements or pixels 31. The wafer 30 is processed at a silicon foundry to yield multiple replicas of the same integrated circuit. Each pixel 31 includes a sensor input 32 that is connected to a charge amplifier 33 and a processing unit 34. The charge amplifier 33 together with the processing unit 34 constitute the pixel electronics to which the sensor element (not shown) is connected and which responds to a photon striking the sensor element for measuring the charge produced thereby. Thus, the silicon wafer 30 contains a very large array of electronic circuits for connecting to a respective sensor element. Control connections to each sensor pixel are made via connections that are routed on the wafer to a controller 35 fabricated at an edge thereof and having terminal pads that serve as I/O ports to the IC. In order that a relatively small number of terminal pads may interface to the very large number of pixels in the complete wafer, the controller 35 includes a multiplexer (not shown) that allows the terminal pads to address any selected sensor element in known manner. Such an approach obviates the need to provide conductive vias through the wafer as is done in WO 03/083944.

Figure 6:
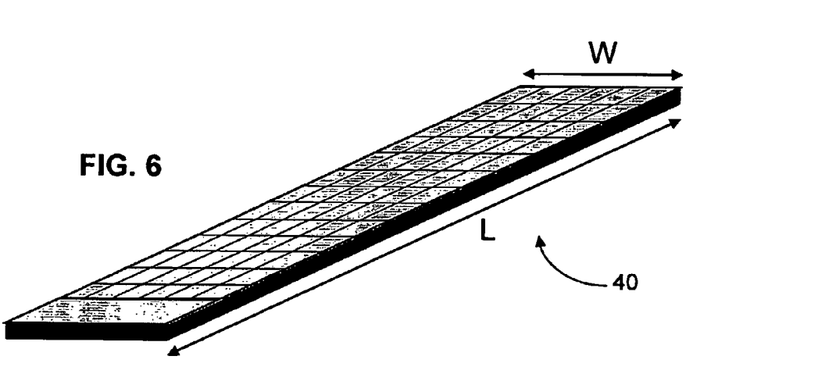
FIG. 6 shows pictorially the fabricated sensor array after completion of the first manufacturing step.

FIG. 6 shows a complete sensor array 40, also referred to as a "pixel stick", having an overall length (L) that may exceed 10 cm and whose width (W) is typically in the order of 1 cm. In order to fabricate a wafer having a very large area, while minimizing failures, an artwork of conventional size corresponding to a pixel array having, for example, 256 pixels is repetitively projected on to the CMOS wafer and processed so as form in a stepped manner a complete wafer having greatly increased area. This technique is known as "stitching" and is described, for example in "*A 35 mm 13.89 million pixel CMOS active pixel sensor*" by G. Meynants et al., IEEE Workshop on CCD & AIS, May 15-17, 2003. The same technique, albeit in a different context, is described and illustrated in "1,024×1,024 *Resistive Emitter Array Design & Fabrication Status*" by Paul Bryant et al., Santa Barbara Infrared, Inc.

Figure 7:
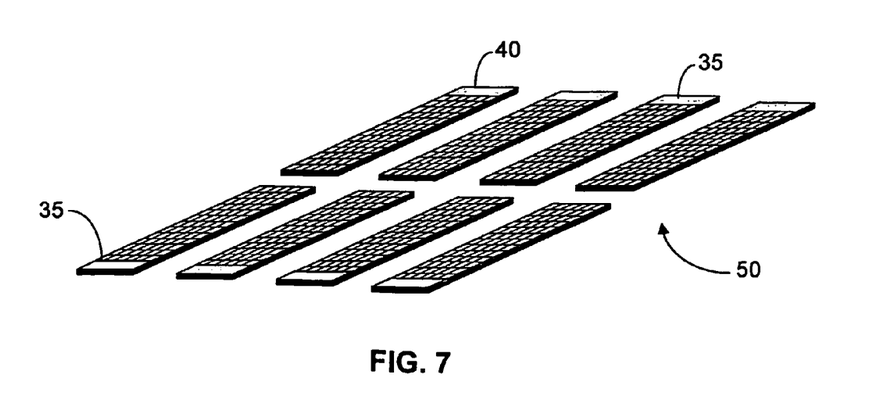
FIG. 7 shows pictorially a plurality of sensor arrays being juxtaposed so as form a detector in a second manufacturing step.
Figure 8:
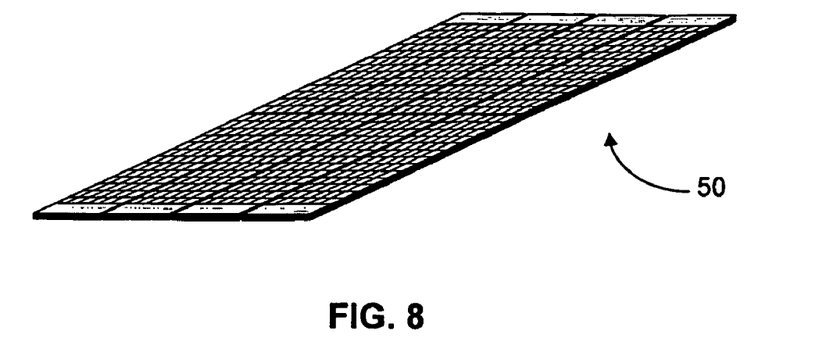
FIG. 8 shows pictorially a two-dimensional array of sensor arrays as shown in FIG. 7 mounted in side-to-side relationship so as to form a composite detector; after completion of the second manufacturing step.

FIGS. 7 and 8 show pictorially a detector 50 formed by juxtaposing a plurality of sensor arrays 40, respectively prior to and after completing a second manufacturing step. The CMOS wafer in each sensor array has a major edge and a minor edge, the major edge having a dimension (L) that is no less than approximately half of the required width of the detector. Multiple pairs of sensor arrays 40 edge to edge so that respective minor edges of each of pair are juxtaposed with the respective terminal pads 35 of each sensor array disposed toward opposing outer non-contiguous edges of the detector 50 and with adjacent pairs of sensor arrays being juxtaposed along their major edges. By such means, the terminal pads 35 are disposed toward opposing outermost edges of the detector 50 and constitute the only "dead space" in the detector since there are no terminal pads between adjoining edges of the detector.

Figure 9:
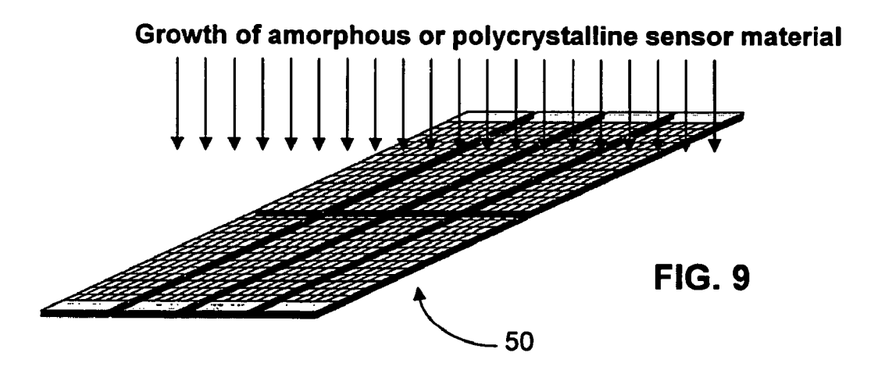
FIG. 9 shows pictorially a third manufacturing step according to the invention for depositing sensor material on the top side of the detector.

Referring to FIG. 9 there is shown a subsequent stage in the manufacturing process where desired amorphous or polycrystalline sensor material such as mercuric iodide is grown on the top surface of the juxtaposed wafers of the assembled detector 50 so as to form an array of diodes, each having a first electrode which is in ohmic contact with a respective one of the sensor inputs 32 (shown in FIG. 5) and such that the opposite, exposed, surface of the sensor material forms a common second electrode of opposite polarity to that of the first electrode towards which incident photons are directed. Typically, the first electrode serves as the anode and the second electrode as the cathode, but this may be reversed depending on how the IC is biased. One suitable way in which the sensor material may be grown on the wafer is described in US 2003/0021382 (Iwanczyk et al.) entitled "*Method and apparatus for fabricating mercuric iodide polycrystalline films for digital radiography*" whose content is incorporated herein by reference.

Figure 10:
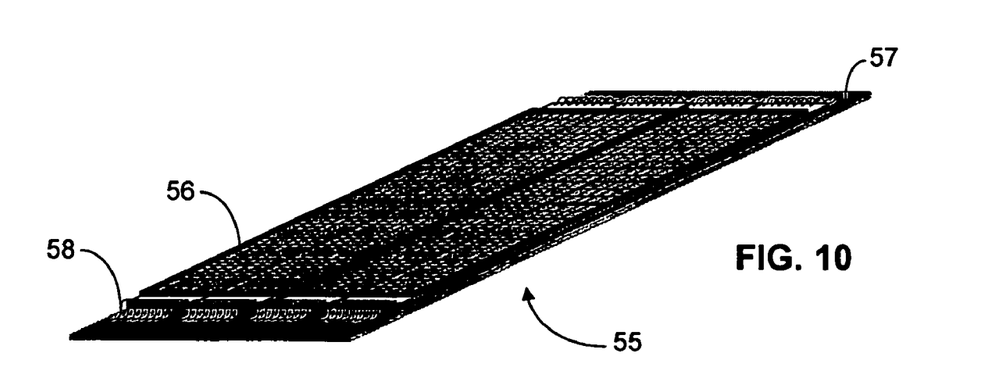
FIG. 10 shows pictorially a detector formed of multiple two-dimensional sensor arrays according to the invention commonly mounted on a printed circuit board, after completion of the third manufacturing step.

FIG. 10 shows pictorially a composite detector 55 after completion of the deposition process having a lower assembly of silicon sensor arrays 40 as described above and shown in FIGS. 6 and 7, on top of which is grown a sensor layer 56 of amorphous or polycrystalline sensor material such as mercuric iodide so as to form a large matrix of sensor elements having a common cathode constituted by the upper surface of the device and a respective anode (not shown) that is effectively sandwiched between the sensor layer 56 and the lower wafer of the silicon sensor arrays 40 and is connected via a corresponding one of the sensor inputs 32 formed in the silicon wafer 30, shown in FIG. 5. The resulting assembly is mounted on a ceramic PCB 57 to which the terminal pads of each controller are connected via wire bonds 58. In practice, the PCB 57 is connected to an external data controller and power supplies as known in the art and preferably the IC(s) are mounted on the PCB 57 before the deposition of the sensor material.

Figure 11:
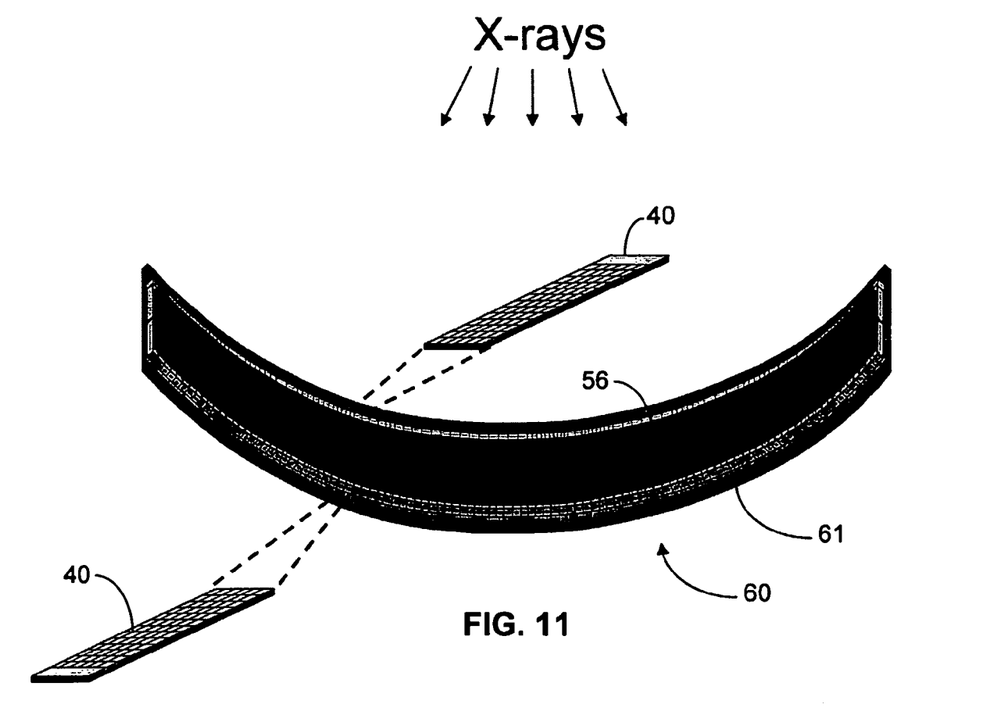
FIG. 11 shows pictorially an arcuate detector formed of multiple two-dimensional sensor arrays according to the invention commonly mounted on a printed circuit board.

FIG. 11 shows pictorially an arcuate detector 60 formed of multiple two-dimensional sensor arrays 40 according to the invention commonly mounted on a printed circuit board 61 and covered with the deposited sensor layer 56, as shown in FIG. 10. The terminal pads 35 are toward opposing outermost edges of the detector 60 and constitute the only "dead space" in the detector since there are no terminal pads between adjoining edges of the constituent sensor arrays. The length of the detector can be increased as required by juxtaposing more pairs of sensor arrays, but the width of the detector is always double the length (L) of a single sensor array. Currently, as noted above, the length (L) of a single sensor array is in the order of 10 cm resulting in a detector width in the order of 20 cm but this will undoubtedly increase as manufacturing techniques improve and is predicted to reach the width of a conventional CT scanner within a few years. This means that for the first time it is possible to manufacture a CT detector having effectively no dead space since, as noted above, providing incident X-rays (for example) are not directed on the outermost edges of the detector there is no dead space between adjoining sensor arrays. In practice, a large area curved PCB is more likely to be formed as a juxtaposition of planar PCB segments.

Figure 12:
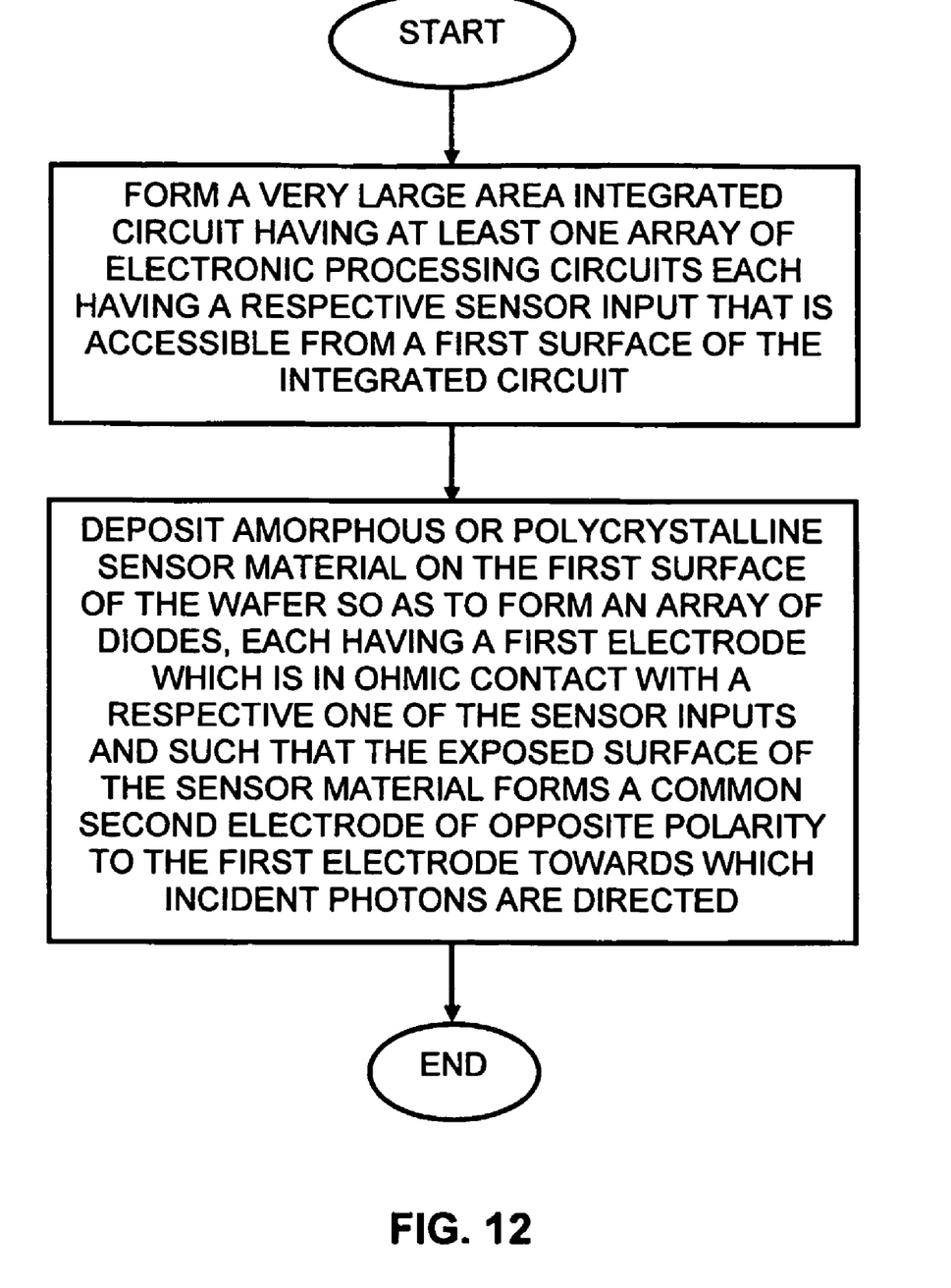
FIG. 12 is a flow diagram summarizing the manufacturing process of a sensor array according to the invention.

FIG. 12 is a flow diagram summarizing the essential features of the above-described manufacturing process of a detector according to the invention, wherein a very large area integrated circuit is formed having at least one array of electronic processing circuits each having a respective sensor input that is accessible from a first surface of the integrated circuit. Amorphous or polycrystalline sensor material is then deposited on the upper surface of the wafer (constituting a first surface) so as to form an array of diodes, each having a first electrode which is in ohmic contact with a respective one of the sensor inputs and such that the exposed surface of the sensor material forms a common second electrode of opposite polarity to the first electrode towards which incident photons are directed.

Whilst, in the preferred embodiment as described above, the sensor elements are themselves grown using mercuric iodide on to the silicon wafer, it will be appreciated that other polycrystalline materials may be used such as amorphous selenium and lead iodide. In all such cases, the sensor material is deposited on top of the wafer in contact with the sensor inputs as described in the preferred embodiment. However, the invention also contemplates the use of crystalline materials such as cadmium zinc telluride, gallium arsenide and mercury cadmium telluride. These are not grown on the wafer but are grown separately to form flat panels that are then deposited on the upper surface of the wafer with each sensor element in registration with a corresponding sensor input and connected thereto via bump bonding. Thus the invention also contemplates the situation where the sensor elements and the sensor electronics are formed in discrete layers, which are bonded together rather than being formed as a monolithic structure. In saying this, it is to be noted that bump-bonding is expensive, which is why polycrystalline deposition is a much more low-cost, and thereby better, approach. In all cases, the invention avoids the need for vias as taught in our WO 03/083944 and the other prior art references discussed above.

Although use of such sensors in X-ray and γ-ray imaging systems has been mentioned, it is to be noted that the invention is not limited to any particular application. Thus, other applications of the invention will be apparent to one skilled in the art and include, without limitation, X-ray computed tomography; night vision sensors; standard medical and industrial X-ray devices; nuclear medicine PET/SPECT sensors; particle detectors; X-ray diffraction detectors and others.

In the preferred embodiment, the electronic processing circuits include amplifiers and further processing circuitry. This allows incident photons to threshold charge the pixel array and to be counted on impact. However, this also is not intended to limit the invention since at their most basic the electronic processing circuits can be simply capacitors that store the incoming charge, in a manner somewhat analogous to a CCD, where charge is read out sequentially similar to a shift register.

It should also be noted that in CMOS technology, the CMOS layer is covered by an insulating layer of silicon oxide, which must be removed if a circuit element is to be exposed in order to allow actual electrical connection thereto. Since in the invention, the sensor elements are deposited on the upper surface of the wafer, the sensor inputs must first be exposed to allow electrical connection of the sensor elements.

Finally, it is to be noted that while the invention has been described with particular reference of the fabrication and assembly of a detector having a plurality of sensor arrays, the sensor array is clearly an essential component of such a detector assembly and could be provided independent of the detector assembly. In such case, there are essentially two possibilities for depositing the sensor material. Manufacturers of mercuric iodide generally recommend that the complete area of the detector be deposited with sensor material so as to cover all component sensor arrays thereof, since this reduces artifacts that can form at the edges of adjacent sensor arrays if the sensor material is deposited on the sensor arrays before assembly. This would tend to militate against the provision of sensor arrays on which sensor material had already been deposited for assembly on to a PCB by an independent party; and would favor the sensor arrays being supplied without the sensor material. The sensor arrays would then be assembled on to a PCB by an independent party who would then deposit the sensor material as described above.

The invention claimed is:

1. A detector assembly having a plurality of pixels that include a sensor element coupled to a sensor input of an electronic processing circuit, the detector assembly comprising:

at least one integrated circuit formed by stitching a plurality of reticles of at least two different types and having an array of electronic processing circuits each having a respective sensor input disposed toward a first surface of the wafer and accessible from the first surface via a terminal pad formed near an edge of the integrated circuit such that each terminal pad serves to access multiple sensor inputs via a controller fabricated at an edge of the wafer;

sensor elements disposed on the first surface of the at least one integrated circuit in said detector assembly whereby an exposed surface of the sensor elements forms a common first electrode towards which incident photons are directed, and an opposite unexposed surface thereof forms multiple second electrodes of opposite polarity to the first electrode each in registration with a corresponding sensor input;

a plurality of rectangular IC modules each fabricated on a very large area CMOS wafer and having a major edge and a minor edge, the major edge having a dimension (L) that is substantially half of a width of the detector, the IC module having at least one array of electronic processing circuits each electronic processing circuit having a respective sensor input disposed toward a first surface of the wafer and accessible from the first surface via a terminal pad formed towards a minor edge of the IC module such that each terminal pad serves to access multiple sensor inputs via a controller fabricated at an edge of the wafer; and multiple pairs of IC modules juxtaposed edge to edge so that respective minor edges of each of pair are juxtaposed with the respective terminal pads of each IC module disposed toward opposing outer non-contiguous edges of the detector and with adjacent pairs of IC modules being juxtaposed along their major edges;

the sensor elements being disposed on the first surface of the respective IC modules in said detector assembly.

2. The detector assembly according to claim 1, wherein the sensor elements include amorphous or polycrystalline sensor material grown on the first surface of the wafer and being capable of detecting incident photons directly.

3. The detector assembly according to claim 1, wherein the sensor elements include monolithically integrated crystalline sensors mounted on the first surface of the wafer in registration with respective sensor inputs.

4. The detector assembly according to claim 1, wherein the detector is configured for use in a high energy photon imaging detector.

5. An IC module for use in manufacture of the detector assembly according to claim 1, the IC module comprising:

a very large area rectangular CMOS wafer having a major edge and a minor edge, the major having a dimension (L) that is substantially half of a width of the detector and having at least one array of electronic processing circuits each electronic processing circuit having a respective sensor input disposed toward a first surface of the wafer and accessible from the first surface via a terminal pad formed towards a minor edge of the sensor array such that each terminal pad serves to access multiple sensor inputs via a controller fabricated at an edge of the wafer.

6. The sensor array according to claim 5, further including sensor material deposited on the first surface thereof.

7. A method for fabricating a detector having a plurality of pixels each including a sensor element coupled to a sensor input of an electronic processing circuit, the method comprising:

integrating the electronic processing circuits on a CMOS wafer by stitching a plurality of reticles of at least two different types so as to form an integrated circuit having an array of electronic processing circuits each having a respective sensor input disposed toward a first surface of the wafer and accessible from the first surface via a terminal pad formed near an edge of the integrated circuit such that each terminal pad serves to access multiple sensor inputs via a controller fabricated at an edge of the wafer;

disposing the sensor elements on the first surface of the respective integrated circuits in said detector whereby an exposed surface of the sensor elements forms a common first electrode towards which incident photons are directed, and an opposite unexposed surface thereof forms multiple second electrodes of opposite polarity to the first electrode each in registration with a corresponding sensor input;

integrating the electronic processing circuits on a plurality of rectangular IC modules each having a major edge and a minor edge, the major edge having a dimension (L) that is substantially half of a width of the detector, such that said terminal pads are formed towards a minor edge of the IC module; and juxtaposing multiple pairs of said IC modules edge to edge so that respective minor edges of each of pair are juxtaposed with the respective terminal pads of each IC module disposed toward opposing outer non-contiguous edges of the detector and with adjacent pairs of IC module being juxtaposed along their major edges;

the sensor elements being disposed on the first surface of the respective IC modules in said detector.

8. The method according to claim 7, wherein disposing the sensor elements includes growing on the first surface of the wafer amorphous or polycrystalline sensor material that is capable of detecting incident photons directly.

9. The method according to claim 8, the amorphous or polycrystalline sensor material is mercuric iodide.

10. The method according to claim 7, further including mounting the detector assembly on a PCB prior to disposing the sensor elements.

11. The method according to claim 7, wherein the detector forms part of a sensor array for a high energy photon imaging detector.

12. A detector assembly manufactured according to the method of claim 7.

* * * * *